United States Patent [19]
Koifman et al.

[11] Patent Number: 5,477,189
[45] Date of Patent: Dec. 19, 1995

[54] OPERATIONAL AMPLIFIER WITH HIGH SLEW RATE

[75] Inventors: Vladimir Koifman, Rishon-Lezion; Yachin Afek, Kfar Saba, both of Israel

[73] Assignee: Motorola, Inc., Schaumburg, Ill.

[21] Appl. No.: 324,039

[22] Filed: Oct. 17, 1994

[30] Foreign Application Priority Data

Oct. 28, 1993 [GB] United Kingdom ............... 9322256

[51] Int. Cl.$^6$ ............................ H03F 3/45; H03F 3/68
[52] U.S. Cl. ........................... 330/253; 330/295; 330/311
[58] Field of Search ..................................... 330/252, 253, 330/255, 295, 311

[56] References Cited

U.S. PATENT DOCUMENTS 4,074,205  2/1978  Rose ........................ 330/257
5,070,307  12/1991 Ta ............................. 330/253

*Primary Examiner*—James B. Mullins
*Attorney, Agent, or Firm*—Harry A. Wolin

[57] ABSTRACT

An operational amplifier (2) comprises a first differential stage (3) for receiving first (IP) and second (IM) input signals and for providing first (OP) and second (OM) output signals at first and second output nodes, and second (4) and third (6) differential stages, which are each coupled to receive the first (IP) and second (IM) input signals and to the first and second output nodes to provide first and second additional signals thereto. Each stage comprises two transistors (22, 24 and 32, 34) differentially connected. One of the transistors of each stage has a greater transconductance than the other, whereby for small input signals the first and second additional signals are negligible and for large input signals when the input signals difference is positive, the second differential stage (4) adds first and second additional signals to the first (OP) and second (OM) output signals respectively and when the input signals difference is negative, the third differential stage (6) adds first and second additional signals to the first (OP) and second (OM) output signals respectively.

7 Claims, 3 Drawing Sheets

OPERATIONAL AMPLIFIER WITH HIGH SLEW RATE

This invention relates to an operational amplifier.

BACKGROUND OF THE INVENTION

All operational amplifiers have a maximum output voltage slew rate. If an input signal at an input of an operational amplifier changes rapidly, it can produce parasitic non-linear distortions. By arranging for the slew rate to be large enough, such distortions can be prevented.

A typical folded cascode operational amplifier is shown in FIG. 1. The differential input signal at inputs IP and IM changes the drain current of transistors M1 and M2, which folds to the outputs OP and OM, via transistors M6 and M7. Transistors M8, M9, M10 and M11 form a high impedance cascode load of the amplifier. This type of amplifier has excellent small signal frequency response but the large signal behaviour often suffers from an insufficiently small output slew rate.

It is clear that the maximum positive output current does not exceed the current through transistors M8 and M9 and that the maximum negative output current is limited by the difference between the currents of transistors M4 (M5) and M8 (M9). These output currents limit the positive and negative slew rates of the amplifier. With a fully differential amplifier, the positive and negative slew rates should be equal. If they are not equal, during the differential input settling time, a common mode component is produced at the differential output OP and OM, which is often undesirable. In order to ensure that the slew rates are equal, the current through transistors M4 and M5 is usually equal to twice that of transistors M10 and M11.

In order to increase the cascode amplifier's slew rate, the DC current of transistors M4 and M5 must be increased. This requires increasing the size of these transistors. This, however, has a disadvantage. As the transistor size is increased, the internal parasitic capacitance of transistors M4, M5, M6 and M7, which are responsible for signal propagation, is increased. Thus, this method leads to a degradation in the amplifier's small signal response and to the lowering of the secondary pole frequency.

A different method of increasing the output slew rate is described in an article 'A high performance micropower switched capacitor filter' by R. Castello, P. Gray, in IEEE Journal of Solid State circuits, VOL. 20, page 1122–1132, Dec 1985. This method is based on using dynamically changing bias current. The bias current changes according to the input signal. Since the bias current changing circuit introduces some delay, the frequency response of such an amplifier suffers dramatically. This type of amplifier has a unity gain frequency which is two to three times lower than that of the amplifier shown in FIG. 1.

It is also known to use a complementary input stage. Such an input stage helps to control the current in transistors M8 and M9, but adds a parallel high frequency signal path. This produces a problem of matching two high frequency signal paths. If the frequency responses of these paths are not exactly equal, additional poles appear in the amplifier's transfer function. This significantly slows down the small signal transient response. In contemporary CMOS technology processes, such precise matching can be achieved, but only using expensive and complex methods, such as laser trimming.

There is therefore a requirement to provide an operational amplifier which has a high slew rate and which does not suffer from the above problems and disadvantages.

SUMMARY OF THE INVENTION

In accordance with the present invention there is provided an operational amplifier comprising:

a first differential stage for receiving first and second input signals and for providing first and second output signals at first and second output nodes;

second and third differential stages, each stage being coupled to receive the first and second input signals and to the first and second output nodes to provide first and second additional signals thereto, each stage comprising two transistors differentially connected, one of the transistors having a greater transconductance than the other, whereby for small input signals the first and second additional signals are negligible and for large input signals when the input signals difference is positive, the second differential stage adds first and second additional signals to the first and second output signals respectively and when the input signals difference is negative, the third differential stage adds first and second additional signals to the first and second output signals respectively.

Thus, the second and third differential stages improve the amplifier slew rate by changing the current at the outputs when the input signal is large.

BRIEF DESCRIPTION OF THE DRAWINGS

An operational amplifier in accordance with the present invention will now be described, by way of example only, with reference to the accompanying drawings in which.

DETAILED DESCRIPTION OF THE DRAWINGS

Figure 2:
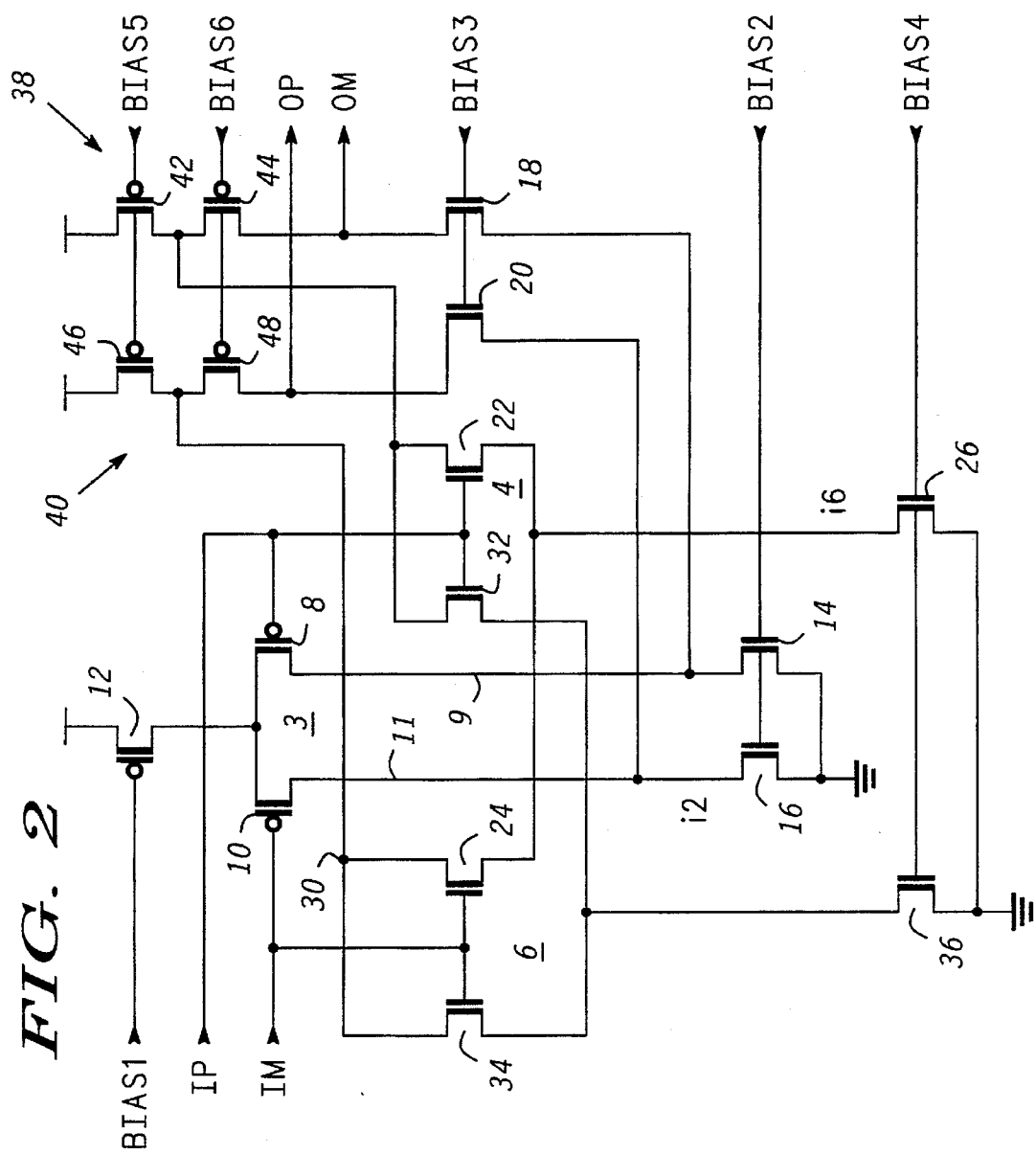
FIG. 2 is a schematic circuit diagram of an operational amplifier in accordance with the present invention.

Referring now to FIG. 2, an operational amplifier 2 in accordance with a preferred embodiment of the invention comprises a first differential stage 3, a second differential stage 4 and a third differential stage 6, each of the three differential stages being coupled to receive a differential input signal at first IP and second IM inputs and being coupled to a differential output OP, OM.

The first differential stage 3 comprises first 8 and second 10 differentially coupled P-channel transistors, whose gate electrodes are coupled to the first IP and second IM inputs respectively. Current is supplied to the differentially coupled transistors 8 and 10 via a P-channel transistor 12, which is coupled to a first supply line and which has a gate electrode coupled to receive a first bias voltage BIAS1. The first differential stage 3 has a first output 9 coupled to the drain electrode of a N-channel transistor 14, whose source electrode is coupled to a second supply line at ground potential, and a second output 11 coupled to the drain electrode of a N-channel transistor 16, whose source electrode is coupled to ground. The gate electrodes of the N-channel transistors 14 and 16 are coupled to receive a second bias voltage BIAS2. The first output 9 is also coupled to the source electrode of a first output N-channel transistor 18, whose drain electrode is coupled to a first output OM. The second output 11 is also coupled to the source electrode of a second output N-channel transistor 20, whose drain electrode is coupled to a second output OP. The gate electrodes of the first and second output transistors are coupled to receive a third bias voltage BIAS3.

The second differential stage 4 comprises first 22 and second 24 differentially coupled N-channel transistors. Current is supplied to the differentially coupled transistors 22 and 24 via a N-channel transistor 26, which is coupled to ground and which has a gate electrode coupled to receive a fourth bias voltage BIAS4. The gate electrode of the first differentially coupled transistor 22 is coupled to the first input IP and the gate electrode of the second differentially coupled transistor 24 is coupled to the second input IM. The second differential stage 4 has a first output coupled to a first node 28 and a second output coupled to a second node 30. The second differential stage 4 is arranged to be significantly asymmetrical, by having one of the differentially coupled transistors 22 and 24 with a much greater transconductance than the other. For example, 10 to 100 times greater. This can be achieved by choosing a larger channel width (10–100 times larger), or a smaller channel width (10–100 times smaller), for one of the differentially coupled transistors 22 and 24, as compared to the other.

The third differential stage 6 comprises third 32 and fourth 34 differentially coupled N-channel transistors. Current is supplied to the differentially coupled transistors 32 and 34 via a N-channel transistor 36, which is coupled to ground and which has a gate electrode coupled to receive the fourth bias voltage BIAS4. The gate electrode of the third differentially coupled transistor 32 is coupled to the first input IP and the gate electrode of the fourth differentially coupled transistor 34 is coupled to the second input IM. The third differential stage 6 has a first output coupled to the first node 28 and a second output coupled to the second node 30. The third differential stage 6 is also arranged to be significantly asymmetrical, by having one of the differentially coupled transistors 32 and 34 with a much greater transconductance than the other. For example, as with the second differential stage 4, between 10 and 100 times greater.

Node 28 is coupled to the first output OM, via a first load 38 and node 30 is coupled to the second output OP, via a second load 40. The first load 38 comprises a first P-channel load transistor 42 coupled in series with a second P-channel load transistor 44, between the first supply line and the first output OM. The gate electrodes of the first 42 and second 44 load transistors are coupled to receive fifth and sixth bias voltages, BIAS5 and BIAS6, respectively. The second load 40 comprises a third P-channel load transistor 46 coupled in series with a fourth P-channel load transistor 48, between the first supply line and the second output OM. The gate electrodes of the third 46 and fourth 48 load transistors are coupled to receive the fifth and sixth bias voltages, BIAS5 and BIAS6, respectively. The fifth and sixth bias voltages BIAS5 and BIAS6 are chosen so that the first 42 and third 46 load transistors have almost constant drain current.

The operation of the preferred operational amplifier 2 will now be described.

For the purposes of illustration, it is assumed that the second transistor 24 of the second differential stage 4 and the third transistor 32 of the third differential stage 6, have smaller channel widths than the first transistor 22 and fourth transistor 34, respectively, by a factor n. This means that the drain current of the second transistor 24 and the third transistor 32 is n times smaller and their transconductance is n times smaller than that of the first 22 and fourth 34 transistors. The differential symmetry of the whole amplifier 2 is preserved by the cross-connection of the gate electrodes and drain electrodes, which ensures that there is one 'weak' transistor and one 'strong' transistor in each of the second and third differential stages.

The transconductance of the transistors 8 and 10 of the first differential stage 3 is chosen to be much greater (10 to 1000 times) than that of the second 24 and third 32 transistors of the second and third differential stages, respectively.

The transconductance $G_m$ of a transistor is given by, $$G_m = \frac{W}{L}(V_{GS} - V_T)K_1$$

Thus, the transconductance increases as the input signal on the gate electrode of the transistor increases.

The small signal response of the amplifier 2 will be considered first.

The transconductance of the differential pair of transistors of each of the second and third differential stages is mainly defined by the 'weak' second 24 and third 32 transistors, respectively. Thus, the transconductance of each of the second 4 and third 6 differential stages is much smaller than the transconductance of the differential transistors 8 and 10 of the first differential stage 3 (10 to 1000 times). In fact for small input signals, the transconductance is so small that the small signal transient and frequency response contribution of the differential pairs of transistors of the second 4 and third 6 differential stages is negligible.

Figure 1:
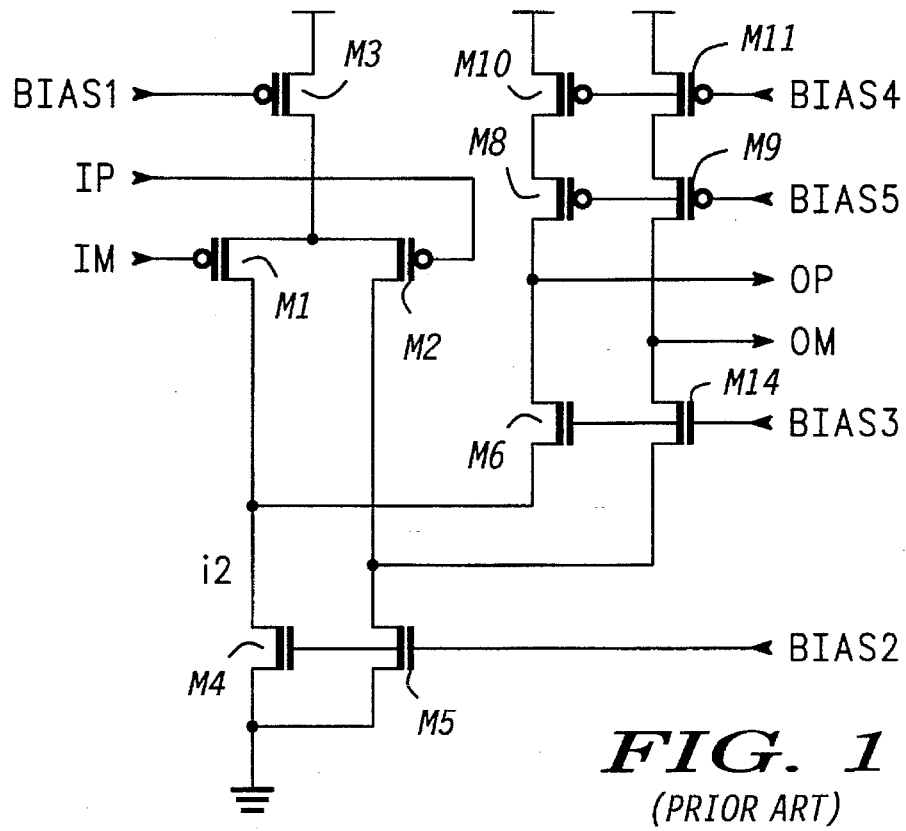
FIG. 1 is a schematic circuit diagram of a prior art folded cascode operational amplifier.

Thus, the small signal transient and frequency response of the amplifier 2 is substantially the same as that of the folded cascode operational amplifier shown in FIG. 1.

The large signal response of the amplifier 2 will now be described, with reference to FIGS. 2, 3 and 4.

Figure 3:
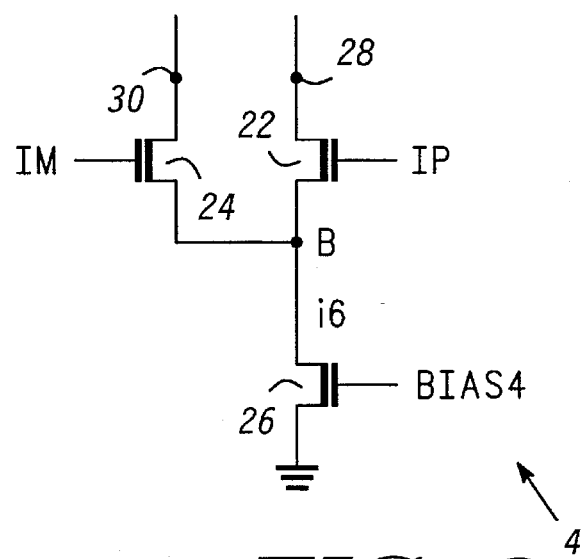
FIG. 3 is a schematic circuit diagram of a differential stage of the circuit of FIG. 2.
Figure 4:
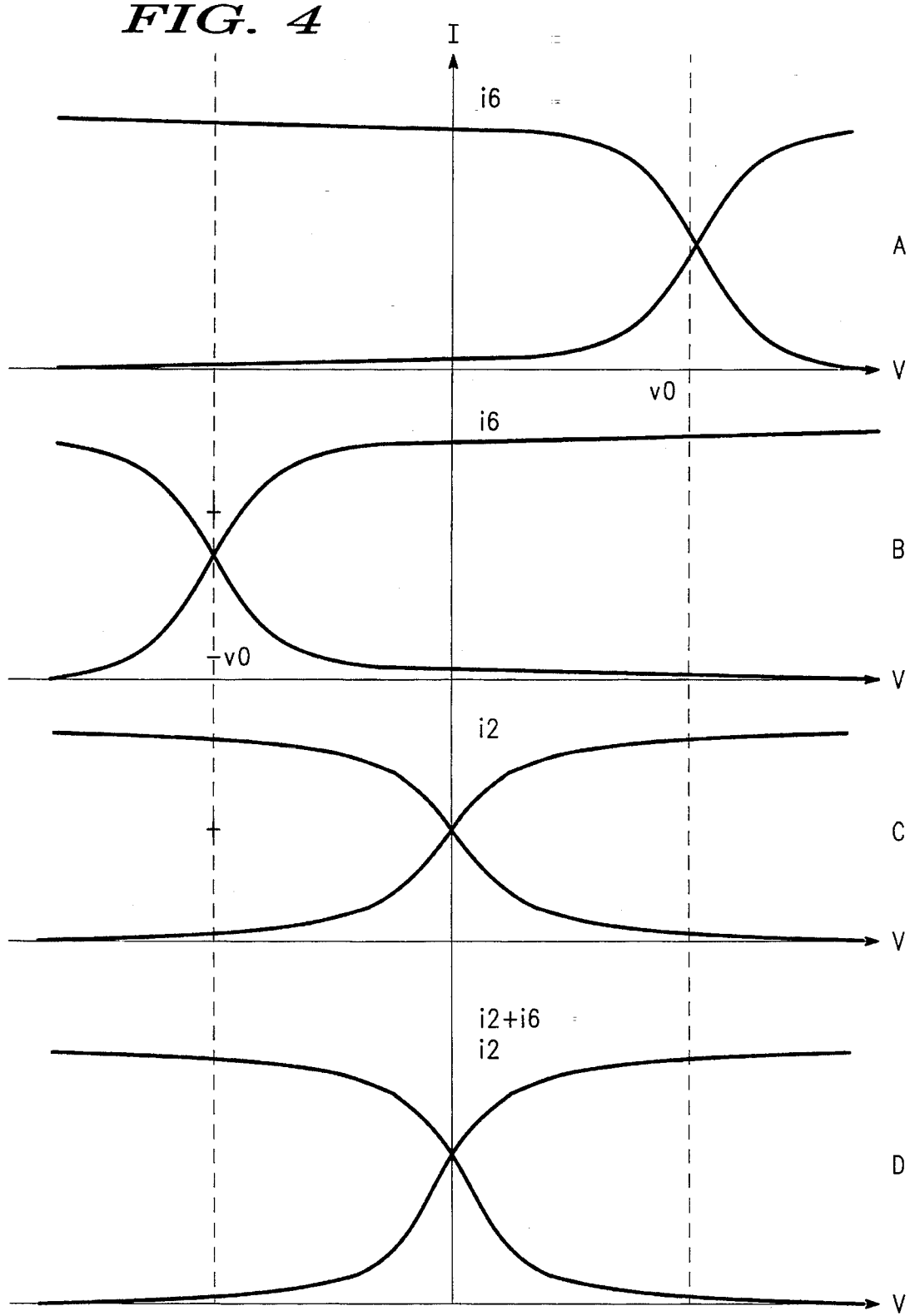
FIG. 4 is a graph showing the dependence of the output current, of the differential stages of FIG. 2, on the differential input signal.

FIG. 3 shows the second differential stage 4 in isolation. FIG. 4 shows the differential stage output current versus voltage level of the differential input signal for the transistor pairs of the first, second and third differential stages: graph A corresponds to the third differential stage 6, graph B corresponds to the second differential stage 4, graph C corresponds to the first differential stage 3 and graph D represents the sum of currents due to the three differential stages 3, 4 and 6.

When both inputs IP and IM on the gate electrodes of the first 22 and second 24 transistors are equal (zero differential input), the bias current, due to transistor 26, splits between the pair of transistors according to their transconductance. In the embodiment described herein, the second, or 'weak', transistor 24 has a smaller transconductance than the first, or 'strong', transistor 22.

When a differential input is applied to inputs IP and IM, the strong transistor 22 behaves as a follower. When a negative input is applied to the strong transistor 22, a 'followed' voltage is produced at node B, which turns the weak transistor 24 'on'. As the input voltage increases, the transconductance of the weak transistor 24 increases, which produces an increase in its drain current. At a predetermined negative differential input voltage V0, the current through transistor 24 is large enough so that the current through both transistors 22 and 24 are equal (see FIG. 4). This produces a corresponding change in the drain current of the fourth load transistor 48, which produces an increase in the current at the second output OP.

The drain current of the third load transistor 46 is equal to the sum of currents through transistors 24 and 34 and through fourth load transistor 48. As the current through transistor 24 increases, the gate-to-source voltage of the fourth load transistor 48 changes, whereby the current through the transistor 48 drops. Thus, if the current through transistor 24 increases, then the current through fourth load transistor 48 decreases in order to preserve charge conservation. Transistors 34, 24 and third load transistor 46 have their drain electrodes connected to node 30. Since these transistors are operating in the saturation region, their drain voltage does not affect their currents.

The strong transistor 22 eventually turns 'off'. At this point, the whole bias current i6 of the second differential stage 4 adds to the current i2 produced by the first differential stage 3 to provide a slew current of i2+i6 at the outputs OP, OM (see D of FIG. 4). By contrast, the slew current of FIG. 1 is just i2.

It will be appreciated that the third differential stage 6 operates in an identical manner for positive input signals, via strong transistor 34 and weak transistor 32, so as to increase the current and slew rate at the outputs OM and OP. See graph A of FIG. 4.

The drain current of a MOSFET transistor is given by the following equation, $$I_D = K_2(V_{GS} - V_T)^2$$

where $V_{GS}$ is the transistor gate-to-source voltage and $V_T$ is the transistor threshold voltage.

Thus, the voltage level V0 is determined by the strong current dependence on the gate source voltage of the transistor.

Thus, for large input signals, the output current is substantially larger, and hence the output slew rate is larger, than that of the prior art circuit of FIG. 1. By comparing the graphs shown in D and C of FIG. 4 respectively, it is possible to compare the output current drive of the operational amplifier 2, in accordance with the present invention, with that of the prior art amplifier of FIG. 1.

When the slew-limited settling of the amplifier 2 ends, the differential input signal between the first input IP and the second input IM decreases significantly and the current in the first 22 and third 32 transistors and second 24 and fourth 34 transistors return to the small-signal negligible level. This means that further settling is as fast as in the operational amplifier of FIG. 1.

In summary, the asymmetry in the second and third differential stages means that these stages act as followers at small input signals, but are active at large differential input signals (comparable to V0 on FIG. 4), so as to add an additional current to the output current of the operational amplifier. The present invention thus provides an operational amplifier having an improved slew rate for large input signals, whilst at the same time ensuring that the small signal response is as good as the folded cascode amplifier of FIG. 1 and reducing the high frequency distortions in the amplifier. The present invention avoids the need for the use of expensive and complex processes to achieve precise matching.

The preferred embodiment provides an increase of 1.5 to 2 times in the maximum slew rate.

We claim:

1. An operational amplifier comprising:
a first differential stage for receiving first and second input signals and for providing first and second output signals at first and second output nodes;
second and third differential stages, each stage being coupled to receive the first and second input signals and to the first and second output nodes to provide first and second additional signals thereto, each stage comprising two transistors differentially connected, one of the transistors having a greater transconductance than the other, whereby for small input signals the first and second additional signals are negligible and for large input signals when the input signals difference is positive, the second differential stage adds first and second additional signals to the first and second output signals respectively and when the input signals difference is negative, the third differential stage adds first and second additional signals to the first and second output signals respectively.

2. An operational amplifier according to claim 1 wherein the second differential stage comprises a first transistor having a gate electrode coupled to receive the first input signal, a drain electrode coupled to the first output node and a source electrode, and a second transistor having a gate electrode coupled to receive the second input signal, a drain electrode coupled to the second output node and a source electrode coupled to the source electrode of the first transistor, and wherein the third differential stage comprises a third transistor having a gate electrode coupled to receive the first input signal, a drain electrode coupled to the first output node and a source electrode, and a fourth transistor having a gate electrode coupled to receive the second input signal, a drain electrode coupled to the second output node, and a source electrode coupled to the source electrode of the third transistor, the second and third differential stages being arranged so that the transconductance of the second and third transistors are greater than the transconductance of the first and fourth transistors respectively.

3. An operational amplifier as claimed in claim 2 wherein for a large positive differential input signal, the first additional signal depends on the drain current of the transistor having the smaller transconductance of the second differential stage and the second additional signal depends on the drain current of the transistor having the greater transconductance of the second differential stage and for a large negative differential input signal, the first additional signal depends on the drain current of the transistor having the greater transconductance of the third differential stage and the second additional signal depends on the drain current of the transistor having the smaller transconductance of the third differential stage.

4. An operational amplifier as claimed in claim 3 further comprising a current source coupled to the drain electrodes of the first, second, third and fourth transistors and to the first and second output nodes, for providing a constant current signal, wherein the first and second additional signals are substantially equal to the difference between the constant current signal and the respective drain currents.

5. An operational amplifier according to claim 4 further comprising a first folding transistor coupled to the drain electrodes of the first and third transistors and the current source for providing the first additional signal and a second folding transistor coupled to the drain electrodes of the second and fourth transistors and the current source for providing the second additional signal.

6. An operational amplifier according to claim 5 wherein the first differential stage comprises fifth and sixth transistors, the fifth transistor having a gate electrode coupled to receive the first input signal, a drain electrode and a source electrode, the sixth transistor having a gate coupled to receive the second input signal, a source electrode coupled to the source electrode of the fifth transistor and a drain electrode, and wherein the operational amplifier further comprises a third folding transistor coupled to the drain electrode of the fifth transistor for providing the first output signal to the first output node and a fourth folding transistor coupled to the drain electrode of the sixth transistor for providing the second output signal to the second output node.

7. An operational amplifier according to claim 1 wherein the first differential stage comprises P-channel transistors and the second and third differential stages each comprises N-channel transistors.

* * * * *